(12) United States Patent
Chen et al.

(10) Patent No.: US 12,464,769 B2
(45) Date of Patent: Nov. 4, 2025

(54) SEMICONDUCTOR DEVICE WITH EPITAXIAL BRIDGE FEATURE AND METHODS OF FORMING THE SAME

(71) Applicant: Taiwan Semiconductor Manufacturing Co., Ltd., Hsinchu (TW)

(72) Inventors: Ting-Yeh Chen, Hsinchu (TW); Wei-Yang Lee, Taipei (TW); Chia-Pin Lin, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 121 days.

(21) Appl. No.: 17/883,234

(22) Filed: Aug. 8, 2022

(65) Prior Publication Data

US 2022/0384660 A1 Dec. 1, 2022

Related U.S. Application Data

(62) Division of application No. 17/127,343, filed on Dec. 18, 2020, now Pat. No. 11,855,225.

(Continued)

(51) Int. Cl.
| | |
|---|---|
| *H10D 30/67* | (2025.01) |
| *H01L 21/02* | (2006.01) |
| *H01L 21/285* | (2006.01) |
| *H10D 30/01* | (2025.01) |
| *H10D 62/00* | (2025.01) |
| *H10D 62/10* | (2025.01) |

(Continued)

(52) U.S. Cl.
CPC ..... *H10D 30/6713* (2025.01); *H01L 21/02532* (2013.01); *H01L 21/02603* (2013.01); *H01L 21/28518* (2013.01); *H10D 30/031* (2025.01); *H10D 30/6735* (2025.01); *H10D 30/6757* (2025.01); *H10D 62/021* (2025.01); *H10D 62/121* (2025.01); *H10D 64/017* (2025.01); *H10D 64/018* (2025.01); *H10D 64/62* (2025.01)

(58) Field of Classification Search
CPC ......... H01L 29/78618; H01L 21/02532; H01L 21/02603; H01L 29/0673; H01L 29/42392
See application file for complete search history.

(56) References Cited

U.S. PATENT DOCUMENTS

| | | |
|---|---|---|
| 9,818,872 B2 | 11/2017 | Ching et al. |
| 9,887,269 B2 | 2/2018 | Ching et al. |

(Continued)

*Primary Examiner* — Brian Turner
(74) *Attorney, Agent, or Firm* — HAYNES AND BOONE, LLP

(57) ABSTRACT

Semiconductor device and the manufacturing method thereof are disclosed. An exemplary semiconductor device comprises semiconductor layers over a substrate, wherein the semiconductor layers are stacked up and separated from each other, each semiconductor layer includes a first portion in a first channel region of the substrate and a second portion in a second channel region of the substrate, epitaxial layers formed in a source/drain region between the first channel region and the second channel region, wherein the epitaxial layers are separated from each other and each epitaxial layer is formed between the first portion and the second portion of each semiconductor layer, and a conductive feature wrapping each of the epitaxial layers.

20 Claims, 16 Drawing Sheets

Related U.S. Application Data

(60) Provisional application No. 62/982,575, filed on Feb. 27, 2020.

(51) Int. Cl.
_H10D 64/01_ (2025.01)
_H10D 64/62_ (2025.01)

(56) References Cited

U.S. PATENT DOCUMENTS

| | | | |
|---|---|---|---|
| 9,899,398 B1 | 2/2018 | Colinge et al. | |
| 10,032,627 B2 | 7/2018 | Lee et al. | |
| 10,109,721 B2 | 10/2018 | Lin et al. | |
| 10,157,799 B2 | 12/2018 | Ching et al. | |
| 10,199,502 B2 | 2/2019 | Huang et al. | |
| 10,290,546 B2 | 5/2019 | Chiang et al. | |
| 10,475,902 B2 | 11/2019 | Lee et al. | |
| 11,211,452 B1* | 12/2021 | Xie | H01L 21/823418 |
| 2015/0372143 A1* | 12/2015 | Bae | H01L 29/7848 257/401 |
| 2016/0268171 A1* | 9/2016 | Wei | H01L 29/66795 |
| 2017/0054003 A1* | 2/2017 | Liao | H01L 29/7848 |
| 2017/0140996 A1* | 5/2017 | Lin | H10D 64/017 |
| 2017/0263706 A1* | 9/2017 | Gardner | H01L 29/775 |
| 2018/0175036 A1 | 6/2018 | Ching et al. | |
| 2019/0067445 A1* | 2/2019 | Ching | H01L 29/785 |
| 2019/0326395 A1 | 10/2019 | Ando | |
| 2019/0348403 A1 | 11/2019 | Mochizuki | |
| 2020/0091288 A1* | 3/2020 | Lee | H01L 29/6656 |
| 2020/0235206 A1 | 7/2020 | Xu | |
| 2020/0279918 A1 | 9/2020 | Wu | |
| 2020/0312980 A1 | 10/2020 | Frougier | |
| 2021/0091230 A1 | 3/2021 | Wu | |
| 2021/0193797 A1* | 6/2021 | Xie | H01L 29/0665 |
| 2021/0193829 A1 | 6/2021 | Reznicek | |

* cited by examiner

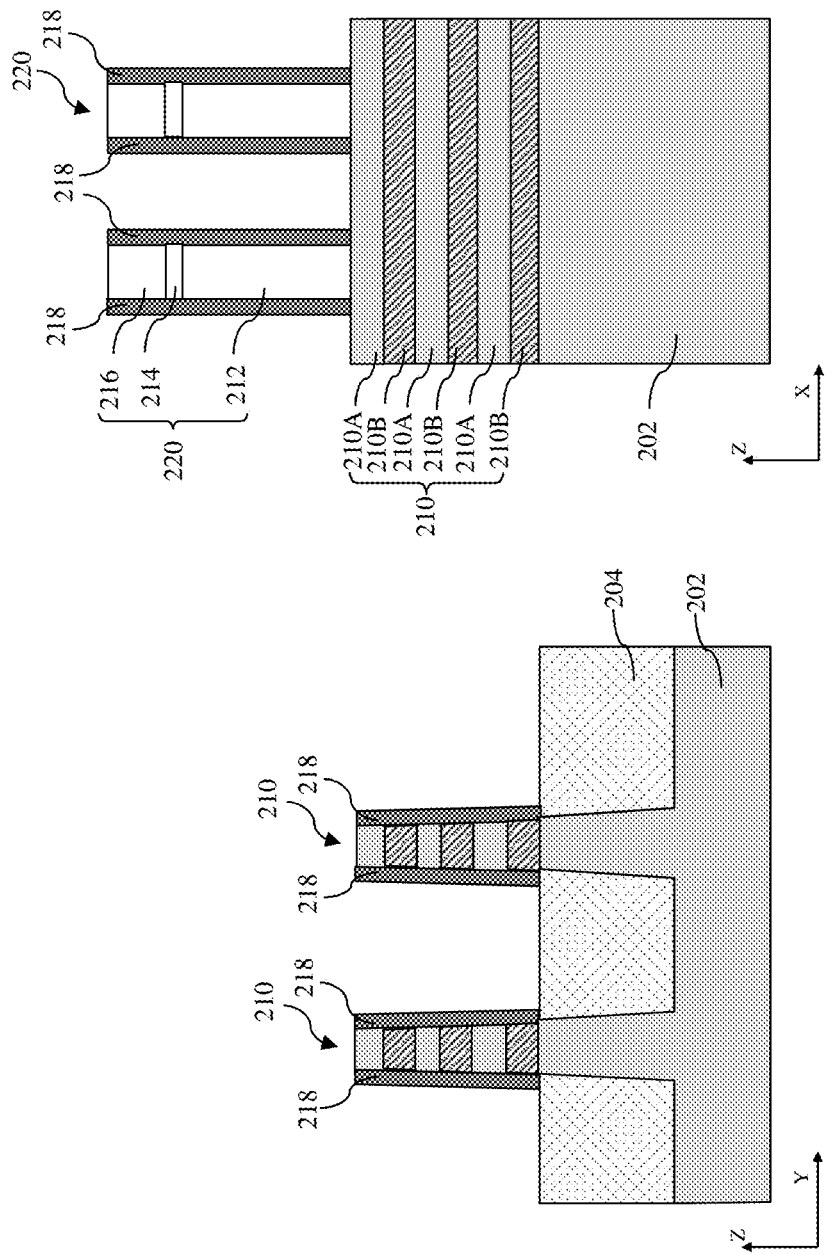

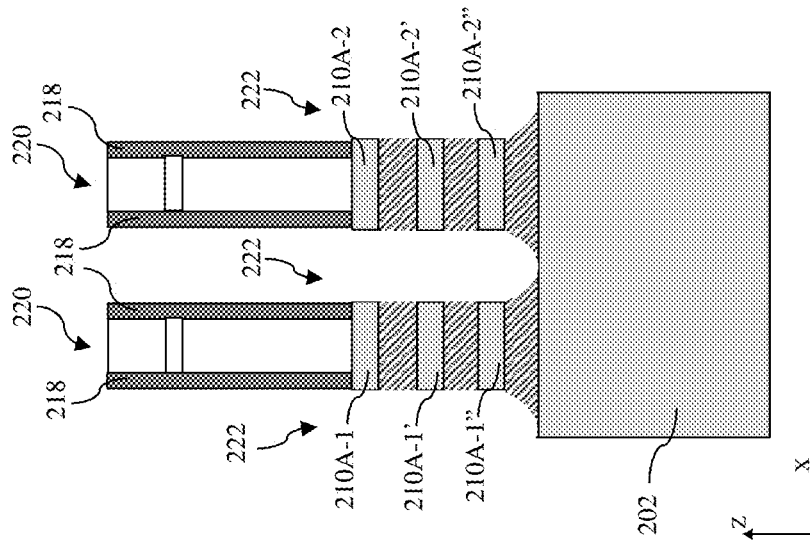
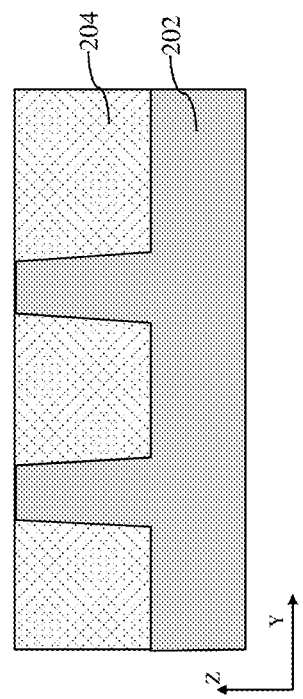
FIG. 6B
FIG. 6A

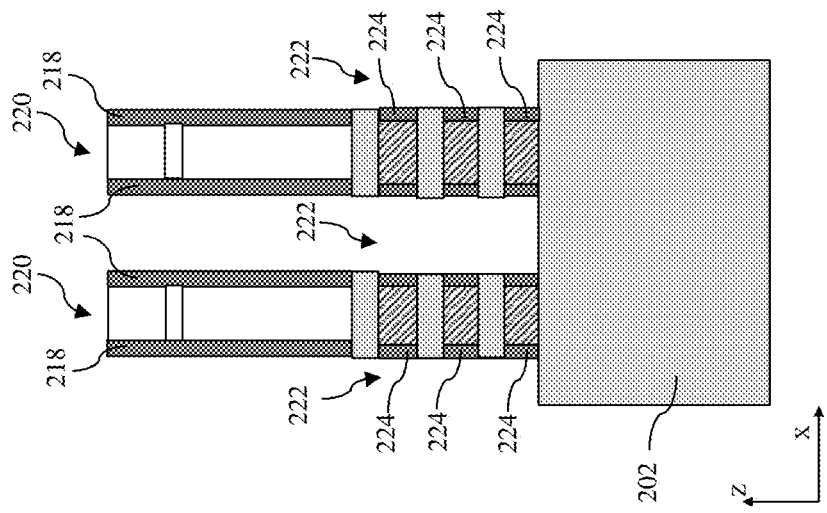
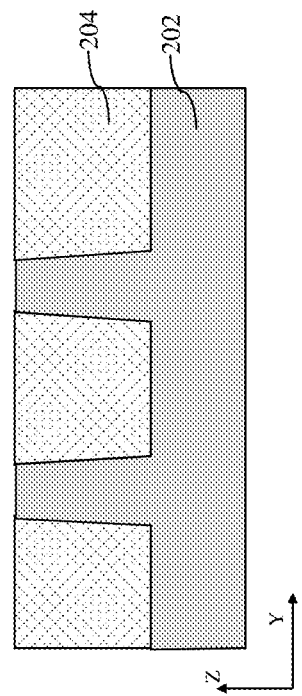
FIG. 7B
FIG. 7A

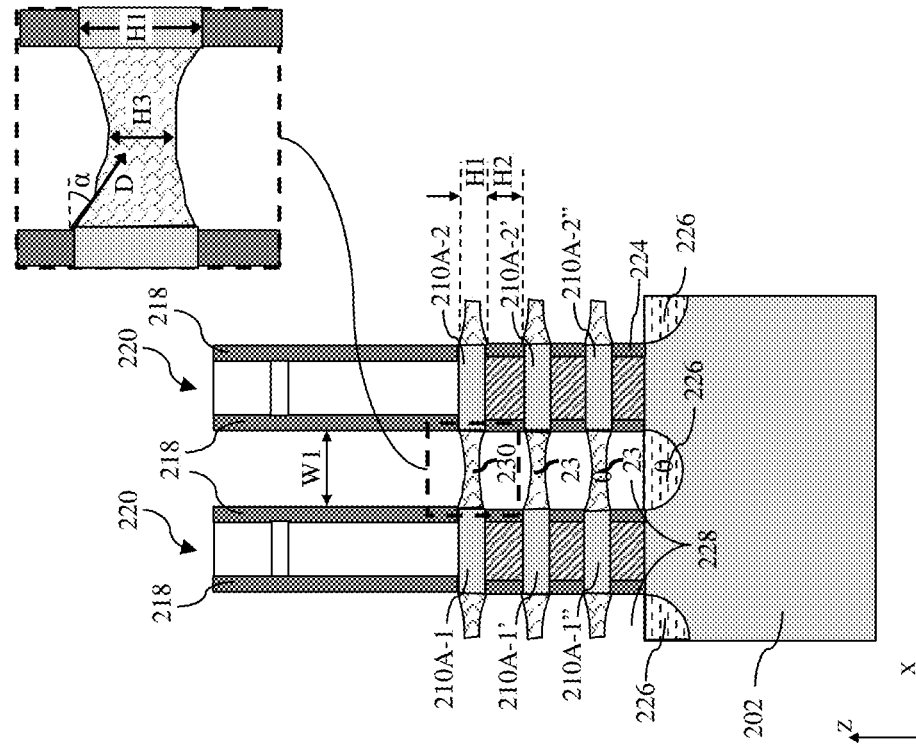
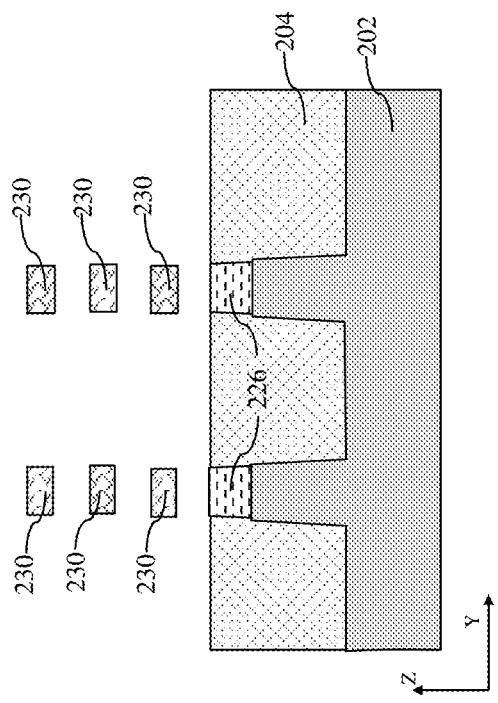
FIG. 10B
FIG. 10A

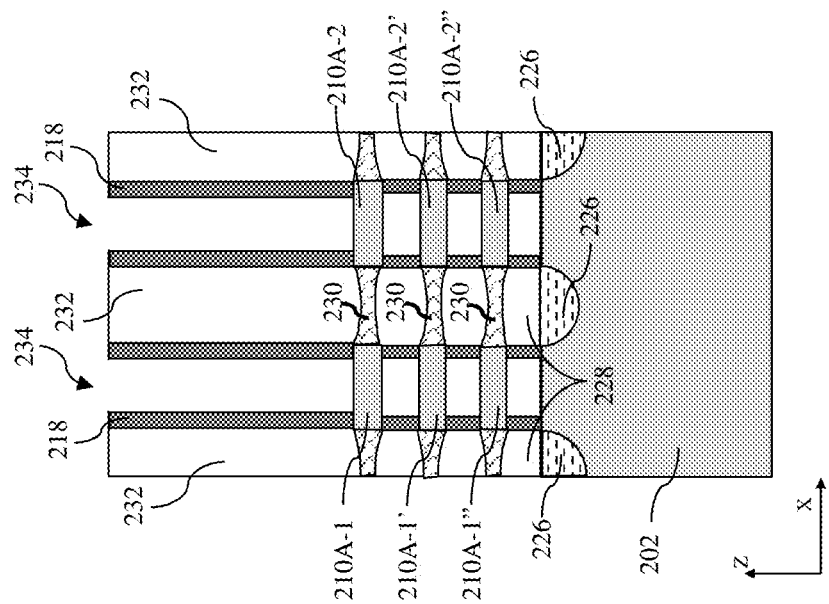
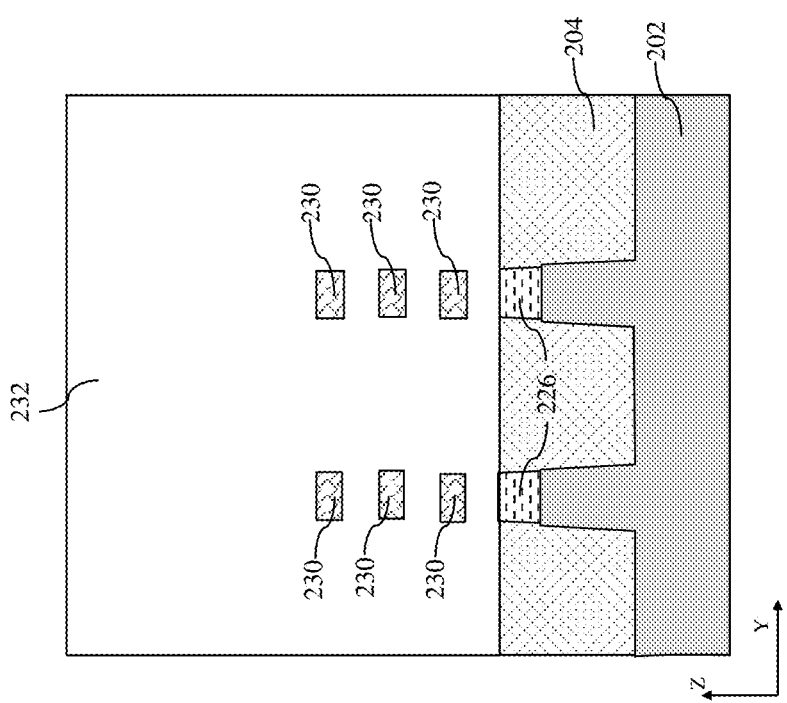
FIG. 12B
FIG. 12A

SEMICONDUCTOR DEVICE WITH EPITAXIAL BRIDGE FEATURE AND METHODS OF FORMING THE SAME

PRIORITY DATA

This application is a divisional application of U.S. patent application Ser. No. 17/127,343, filed Dec. 18, 2020, which claims benefit of U.S. Provisional Patent Application Ser. No. 62/982,575, filed Feb. 27, 2020, each of which is incorporated herein by reference in its entirety.

BACKGROUND

The integrated circuit (IC) industry has experienced exponential growth. Multi-gate devices have been introduced to improve gate control by increasing gate-channel coupling and reducing off-state current. One such multi-gate device is a gate-all-around (GAA) device (also referred to as nanostructure device). A GAA device generally refers to any device having a gate structure, or portions thereof, formed on more than one side of a channel region (for example, surrounding a portion of the channel region). GAA transistors allow aggressive scaling down of transistors. However, such scaling down has also increased the complexity of processing and manufacturing ICs. In a conventional GAA device, although the channel semiconductor layers are separated from each other, the epitaxial source/drain (S/D) features are bulk features. The time to charge and/or discharge the bulk S/D feature is relatively long and the capacitance is relatively large due to the size of the bulk S/D feature. Thus, the performance of the semiconductor device is degraded. Therefore, improvements are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-16A illustrate cross-sectional views of the semiconductor device along line A-A' in the three-dimensional perspective view at intermediate stages of the method of FIG. 1 in accordance with some embodiments of the present disclosure.

FIGS. 3B-16B illustrate cross-sectional views of the semiconductor device along line B-B' in the three-dimensional perspective view at intermediate stages of the method of FIG. 1 in accordance with some embodiments of the present disclosure.

DETAILED DESCRIPTION

Figure 1:
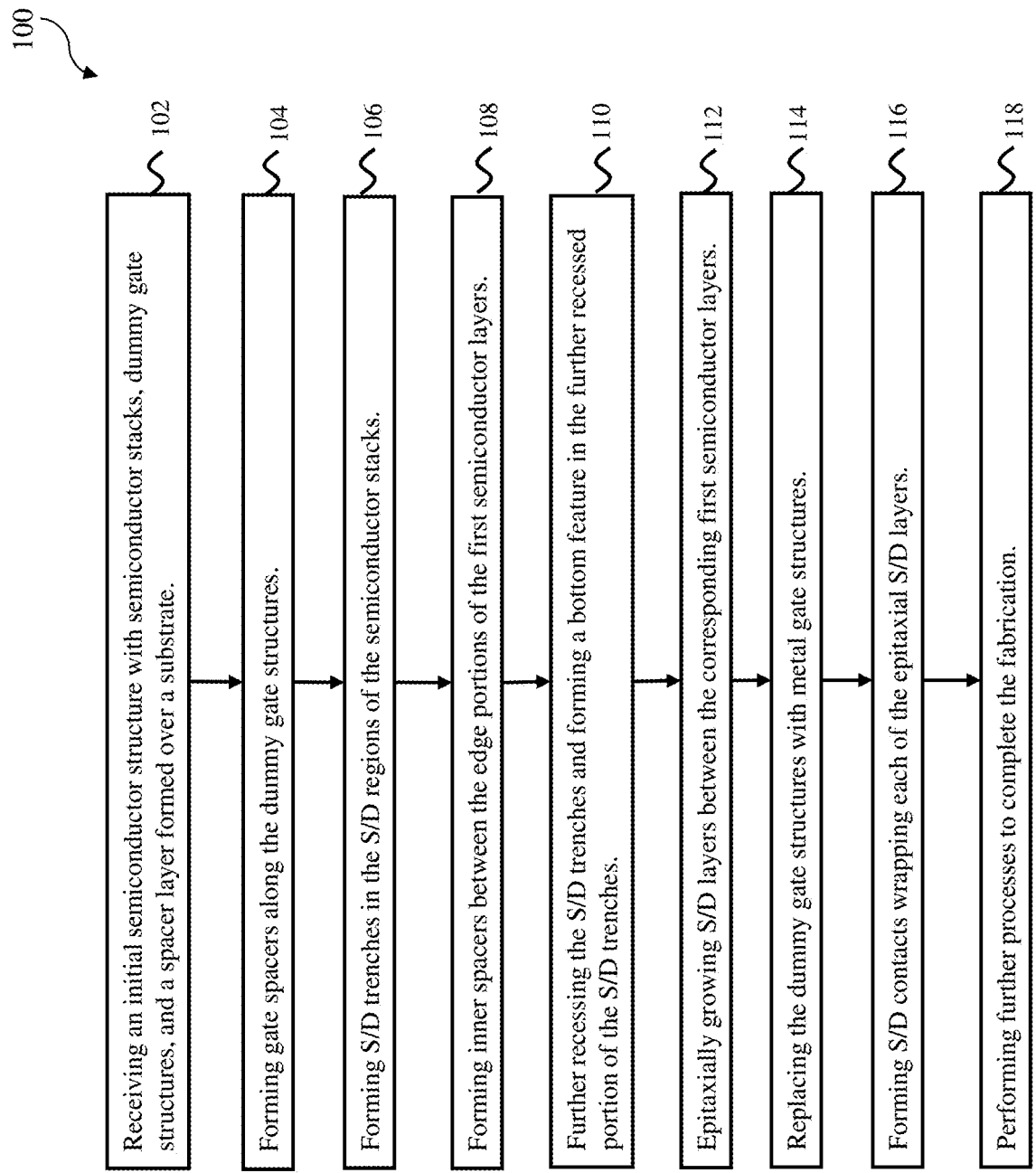
FIG. 1 illustrates a flowchart of an example method for making an example semiconductor device in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may comprise embodiments in which the first and second features are formed in direct contact, and may also comprise embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may comprise embodiments in which the features are formed in direct contact, and may also comprise embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to methods of fabricating field-effect transistors (FETs), such as gate-all-around FETs (GAA FETs).

In a GAA device, a channel region of a single device may comprise multiple layers of semiconductor material physically separated from one another. In some examples, a gate of the device is disposed above, alongside, and even between the semiconductor layers of the device. In a conventional GAA device, the epitaxial S/D feature is a bulk feature epitaxially grown in the S/D regions of the semiconductor device. Since the charging and discharging of the epitaxial S/D feature is related with the size of the epitaxial S/D feature, a large size bulk epitaxial feature may need longer time to be charged/discharged and cause a large capacitance. In the present disclosure, based on the specific channel profile of the GAA device, i.e. the channel semiconductor layers are physically separated from each other, the epitaxial S/D features are grown as epitaxial layers (like a bridge) between the corresponding portions of the channel semiconductor layers. The bridge epitaxial S/D layers can work effectively as an epitaxial S/D feature but with a smaller size. The smaller size epitaxial feature need less time to charge and/or discharge and the capacitance is smaller than the bulk epitaxial feature. S/D contacts are then formed to wrap each epitaxial layer. And, a bottom dielectric feature may be formed between the S/D contacts and the substrate to reduce the current leakage therebetween. Thus, the speed of the semiconductor device can be increased, and the capacitance is reduced. Thereby, the performance of the semiconductor device is improved.

Figure 2:
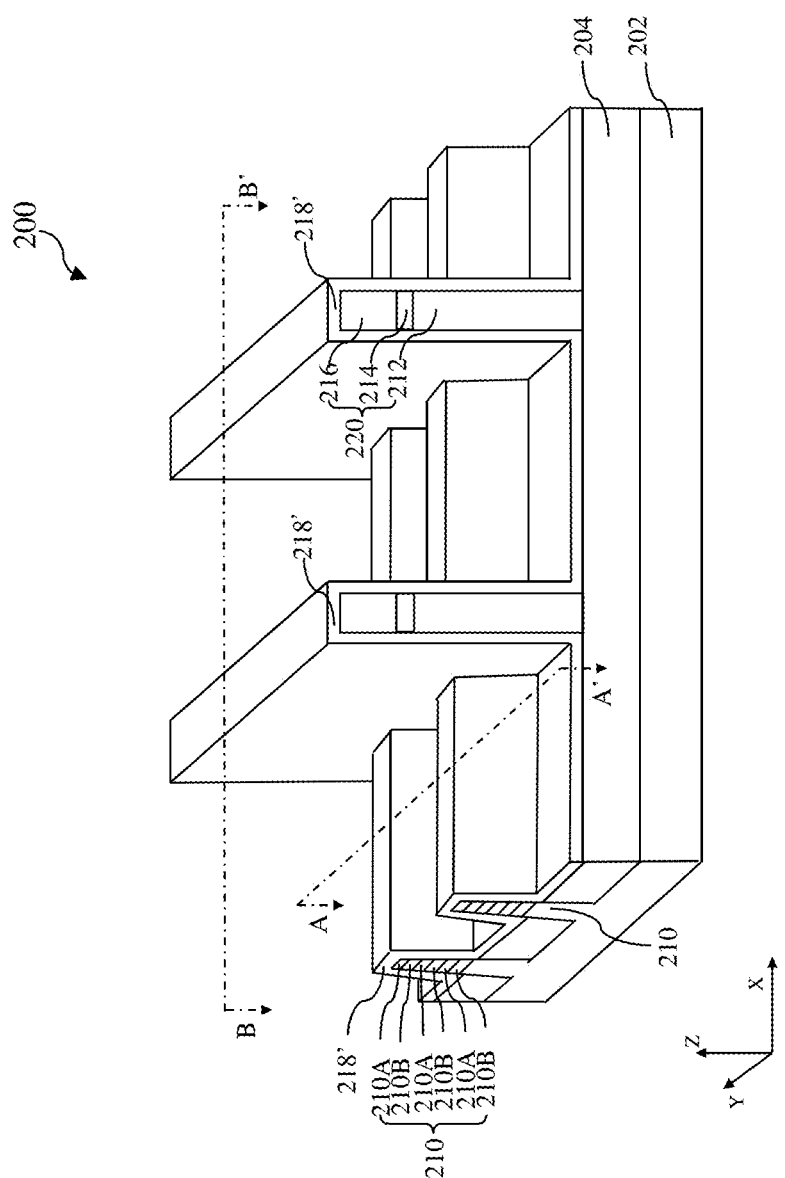
FIG. 2 illustrates a three-dimensional perspective view of the initial example semiconductor device accordance with some embodiments of the present disclosure

FIG. 1 illustrates a flow chart of a method 100 for making an example semiconductor device 200 (hereinafter, device 200) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate various three-dimensional and cross-sectional views of the device 200 during intermediate steps of method 100. In particular, FIG. 2 is a three-dimensional view of an initial structure of device 200 in accordance with some embodiments of the present disclosure. FIGS. 3A-16A illustrate cross-sectional views of the device 200 taken along the plane A-A' shown in FIG. 2 (that is, in an Y-Z plane) at intermediate stages of the method 100 in accordance with some embodiments of the present disclosure. FIGS. 3B-16B illustrate cross-sectional views of the device 200 taken along the plane B-B' shown in FIG. 2 (that is, in an X-Z plane) at intermediate stages of the method 100 in accordance with some embodiments of the present disclosure.

Device 200 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type FETs (PFETs), n-type FETs (NFETs), metal-oxide semiconductor field effect transistors (MOSFET), complementary metal-oxide semiconductor (CMOS) transistors, bipolar transistors, high voltage transistors, high frequency transistors, and/or other memory cells. Device 200 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an integrated circuit (IC). In some embodiments, device 200 may be a portion of an IC chip, a system on chip (SoC), or portion thereof. The present disclosure is not limited to any particular number of devices or device regions, or to any particular device configurations.

Figures 3A, 3B:
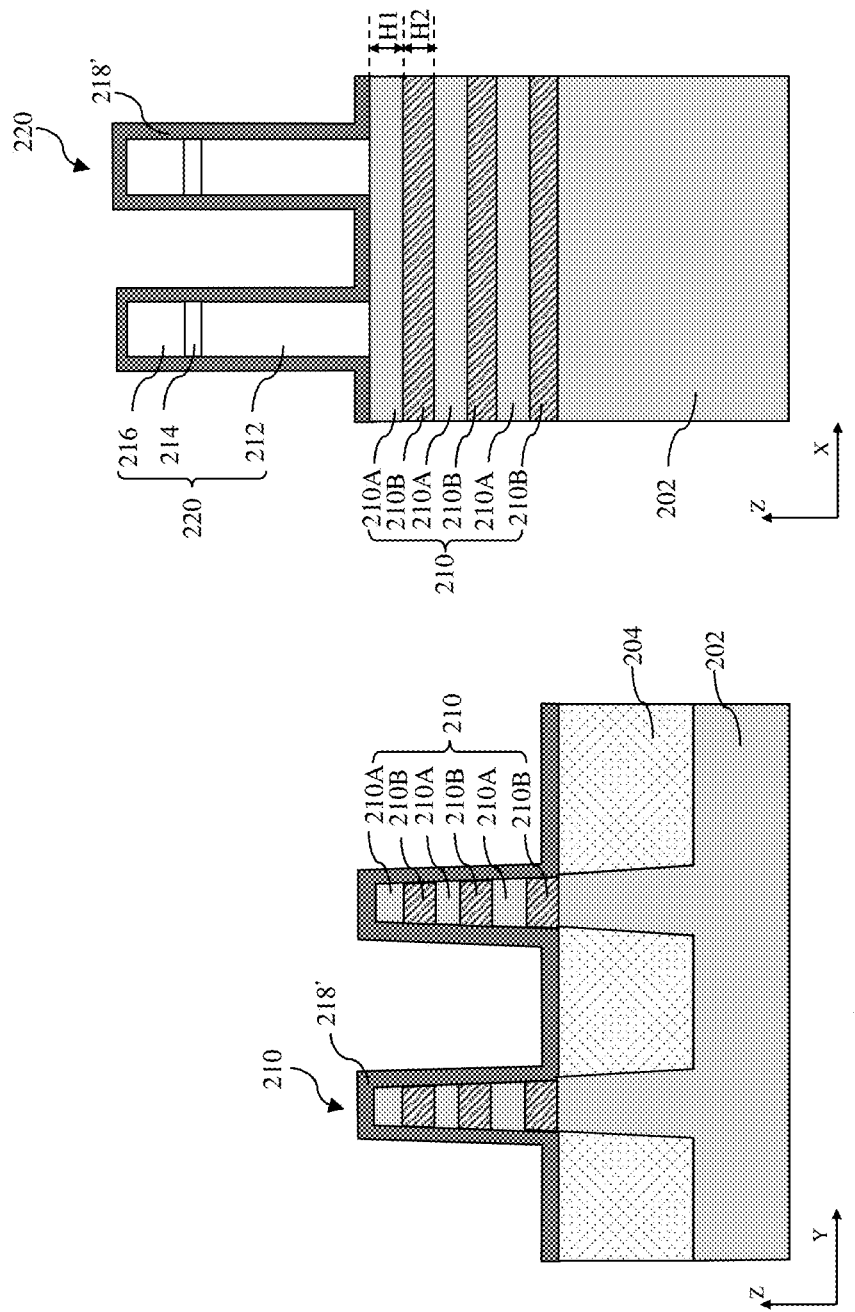

Referring to FIGS. 1, 2, 3A and 3B, at operation 102, an initial semiconductor structure of device 200 is formed. As depicted in FIGS. 2, 3A and 3B, device 200 comprises a substrate 202. In the depicted embodiment, the substrate 202 is a bulk silicon substrate. Alternatively or additionally, the substrate 202 includes another single crystalline semiconductor, such as germanium; a compound semiconductor; an alloy semiconductor; or combinations thereof. Alternatively, the substrate 202 is a semiconductor-on-insulator substrate, such as a silicon-on-insulator (SOI) substrate, a silicon germanium-on-insulator (SGOI) substrate, or a germanium-on-insulator (GOI) substrate. The substrate 202 may be doped with different dopants to form various doped regions therein. For example, the substrate 202 may include PFET region comprising n-type doped substrate regions (such as n-well) and NFET region comprising p-type doped substrate regions (such as p-well).

The device 200 includes alternating semiconductor layers formed over the substrate 202, such as semiconductor layers 210A including a first semiconductor material and semiconductor layers 210B including a second semiconductor material that is different from the first semiconductor material. The different semiconductor materials of the semiconductor layers 210A and 210B have different oxidation rates and/or different etch selectivity. In some embodiments, the first semiconductor material of the semiconductor layers 210A is the same as the substrate 202. For example, the semiconductor layers 210A comprise silicon (Si, like the substrate 202), and the semiconductor layers 210B comprise silicon germanium (SiGe). Thus, alternating SiGe/Si/SiGe/Si/ . . . layers are arranged from bottom to top. In some embodiments, the material of the top semiconductor layer may or may not be the same as the bottom semiconductor layer. In some embodiments, no intentional doping is performed when forming the semiconductor layers 210A. In some other embodiments, the semiconductor layers 210A may be doped with a p-type dopant or an n-type dopant. The number of the semiconductor layers 210A and 210B depends on the design requirements of device 200. For example, it may comprise one to ten layers of semiconductor layers 210A or 210B each. In some embodiments, different semiconductor layers 210A and 210B have the same thickness in the Z-direction. In some other embodiments, different semiconductor layers 210A and 210B have different thicknesses. Referring to FIG. 3B, each of the first semiconductor layers 210A has a thickness H1 in the Z-direction and each of the second semiconductor layers 210B has a thickness H2 in the Z-direction. In some embodiment, the thickness H1 is about 5 nm to about 20 nm and the thickness H2 is about 5 nm to about 20 nm. In some embodiments, the semiconductor layers 210A and/or 210B are formed by suitable epitaxy process. For example, semiconductor layers comprising SiGe and Si are formed alternately over the substrate 202 by a molecular beam epitaxy (MBE) process, a chemical vapor deposition (CVD) process, such as a metal organic CVD (MOCVD) process, and/or other suitable epitaxial growth processes.

Thereafter, the alternating semiconductor layers 210A and 210B are patterned to form semiconductor stacks 210 (hereinafter the stacks 210). In some embodiments, various photoresist lithography and etching processes may be performed to the semiconductor layers 210A and 210B to form the stacks 210 in fin-shapes as illustrated. For example, first, a patterned photoresist mask is formed over the device 200. The patterned photoresist mask covers the fin positions according to the design requirement of device 200. Subsequently, one or more etching processes are performed using the patterned photoresist mask to remove the exposed portions of the first and second semiconductor layers 210A and 210B. The remained portions of the first and second semiconductor layers 210A and 210B form the fin-shape stacks 210. In some embodiments, a top portion of the substrate 202 is also removed. The etching process includes dry etching, wet etching, other suitable etching process, or combinations thereof. And, the photoresist mask is then removed using any proper method.

Thereafter, an isolation structure 204 is formed in the trenches between the stacks 210 to separate and isolate the active regions of device 200. In some embodiments, one or more dielectric materials, such as silicon oxide (SiO) and/or silicon nitride (SiN), is deposited over the substrate 202 along sidewalls of the stack 210. The dielectric material may be deposited by CVD (such as plasma enhanced CVD (PECVD)), physical vapor deposition (PVD), thermal oxidation, or other techniques. Subsequently, the dielectric material is recessed (for example, by etching and/or chemical mechanical polishing (CMP)) to form the isolation structure 204. In some embodiments, a top surface of the isolation structure 204 is substantially coplanar with or below a bottom surface of the lowermost second semiconductor layer 210B, as depicted in FIG. 3A.

Subsequently, dummy gate structures 220 are formed over the stacks 210. Each dummy gate structure 220 serves as a placeholder for subsequently forming a metal gate structure.

In some embodiments, the dummy gate structures 220 extend along the Y-direction and traverse respective stacks 210. The dummy gate structures 220 cover the channel regions of the stacks 210 which interpose the source regions and the drain regions (both referred to as the S/D regions). Each of the dummy gate structures 220 may include various dummy layers, for example, an interfacial layer (not shown), a dummy gate electrode 212 (including polysilicon), one or more hard mask layers 214 and 216 (including a dielectric material such as SiN, silicon carbonitride (SiCN), SiO, etc.), and/or other suitable layers. The dummy gate structures 220 are formed by deposition processes, lithography processes, etching processes, other suitable processes, or combinations thereof. For example, different dummy layers are deposited over the stacks 210. A lithography process is then performed to form a mask covering the channel regions of the stacks 210. Thereafter, the different dummy layers are etched using the lithography mask to form the dummy gate structures 220. And, the lithography mask is removed using any proper method.

A gate spacer layer 218' is then formed over the device 200, for example, over the isolation structure 204, along sidewalls and over top surfaces of the dummy gate structures 220, and along sidewalls and over top surfaces of the stacks 210. In some embodiments, the gate spacer layer 218' comprises a dielectric material, such as SiO, SiN, silicon oxynitride (SiON), silicon carbide (SiC), other dielectric material, or a combination thereof. The gate spacer layer 218' is formed by a deposition process (for example, by atomic layer deposition (ALD), CVD, PVD, or other proper process).

Figures 5A, 5B:
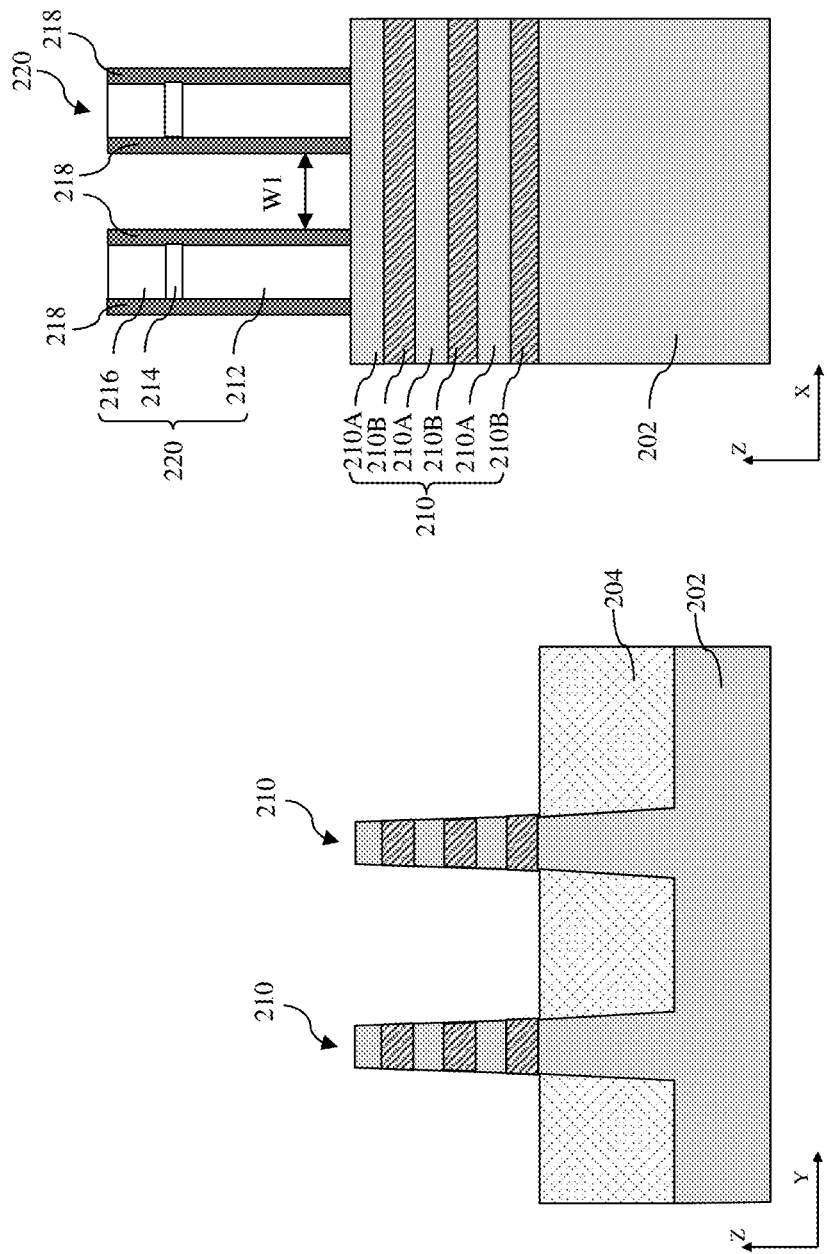

Referring to FIGS. 1, 4A, 4B, 5A, and 5B, at operation 104, the spacer layer 218' is anisotropically etched to form the gate spacers 218. As depicted in FIGS. 4A and 4B, an anisotropically etching is performed to remove the portions of the spacer layer 218' in the X-Y plane (the plane in which the top surface of the substrate 202 is). The remaining portions of the spacer layer become the gate spacers 218. The anisotropically etching includes wet etching, dry etching, or combinations thereof. Referring to FIGS. 5A and 5B, still at operation 104, the spacers 218 in the S/D regions along the sidewalls of the stacks 210 are then removed by suitable etching processes. As depicted in FIG. 5B, a distance W1 between the adjacent spacers 218 along sidewalls of the dummy gate structures 220 is about 30 nm to about 50 nm.

Thereafter, referring to FIGS. 1, 6A, and 6B, at operation 106, S/D trenches 222 are formed in the S/D regions of the stacks 210. In some embodiments, the stacks 210 are recessed by a S/D etching process along sidewalls of the gate spacers 218 to form the S/D trenches 222. The S/D etching process may be a dry etching process (such as a reactive ion etching (ME) process), a wet etching process, or combinations thereof. The duration of the S/D etching process is controlled such that the sidewalls of each semiconductor layers 210A and 210B are exposed in the S/D trenches 222. In other words, as depicted in FIG. 6B, the semiconductor layers 210A and 210B are truncated by the S/D trenches 222. Each semiconductor layer 210A is separated into two or more corresponding portions. For example, referring to FIG. 6B, the semiconductor layer portion 210A-1 corresponds to the semiconductor layer portion 210A-2; the semiconductor layer portion 210A-1' corresponds to the semiconductor layer portion 210A-2'; and the semiconductor layer portion 210A-1" corresponds to the semiconductor layer portion 210A-2".

Now referring to FIGS. 1, 7A, and 7B, at operation 108, inner spacers 224 are formed between the edge portions of the semiconductor layers 210A. In some embodiments, the portions (edges) of the semiconductor layers 210B exposed in the S/D trenches 222 are selectively removed by a suitable etching process to form gaps between the edge portions of the semiconductor layers 210A. In other words, the edge portions of the semiconductor layers 210A are suspended in the S/D trenches 222. Due to the different oxidation rates and/or etching selectivities of the materials of the semiconductor layers 210A (for example, Si) and 210B (for example, SiGe), only exposed portions (edges) of the semiconductor layers 210B are removed, while the semiconductor layers 210A remain substantially unchanged. In some embodiments, the selective removal of the exposed portions of the semiconductor layers 210B may include an oxidation process followed by a selective etching process. For example, the edge portions of the semiconductor layers 210B are first selectively oxidized to include a material of SiGeO. Then, a selective etching process is performed to remove the SiGeO with a suitable etchant such as ammonium hydroxide (NH4OH) or hydro fluoride (HF). The duration of the oxidation process and the selective etching process can be controlled such that only edge portions of the semiconductor layers 210B are selectively removed.

Thereafter, inner spacers 224 are formed to fill in the gaps between the semiconductor layers 210A. The inner spacers 224 comprise a dielectric material that is similar to the material of the gate spacers 218, such as SiO, SiN, SiON, SiC, or combinations thereof. The dielectric material of the inner spacers may be deposited in the S/D trenches 222 and in the gaps between the edges of the semiconductor layers 210A by CVD, PVD, ALD, or combinations thereof. Extra dielectric material is then removed along sidewalls of the gate spacers 218 until the sidewalls of the semiconductor layers 210A are exposed in the S/D trenches 222.

Figure 8B:
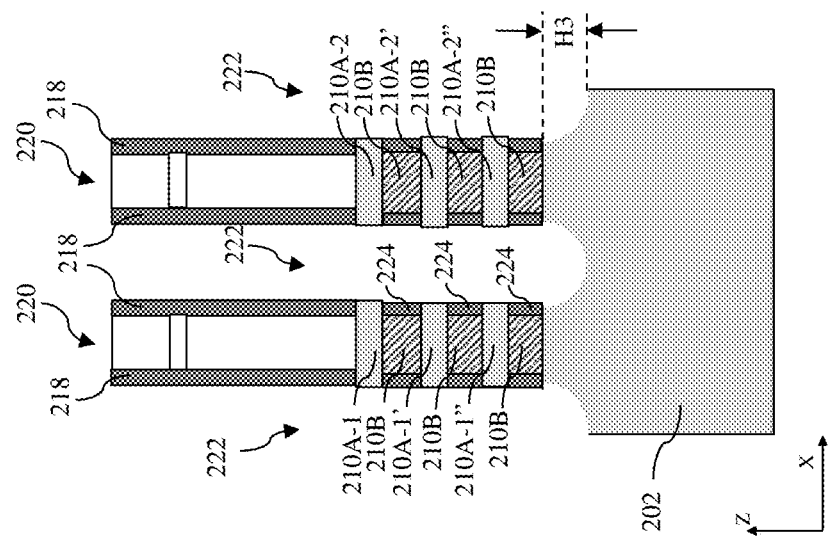
Figure 8A:
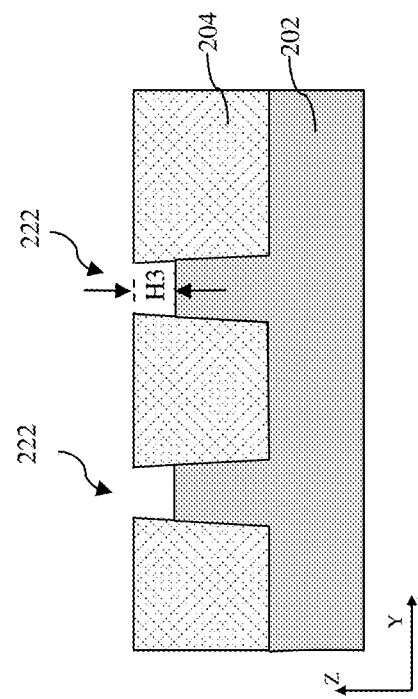

Now referring to FIGS. 1, 8A, 8B, 9A, and 9B, at operation 110, the S/D trenches 222 are further recessed and a bottom feature 226 is formed in the further recessed portion of the S/D trenches 222. Referring to FIGS. 8A and 8B, the S/D trenches 222 are further etched such that top portions of the substrate 202 is removed and bottom surfaces of the S/D trenches 222 are below the bottom surfaces of the lowermost second semiconductor layer 210B. In some embodiments, the S/D trenches 222 are further etched for a depth H3 of about 20 nm to about 40 nm.

Figure 9B:
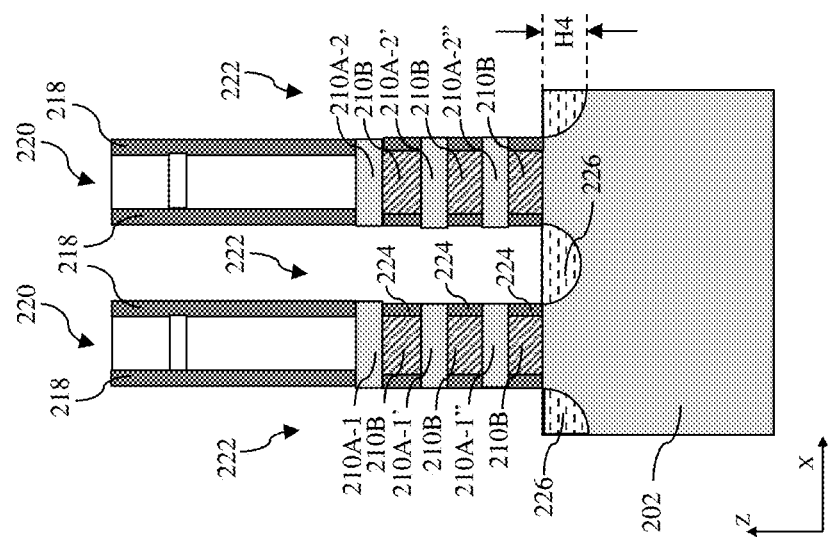
Figure 9A:
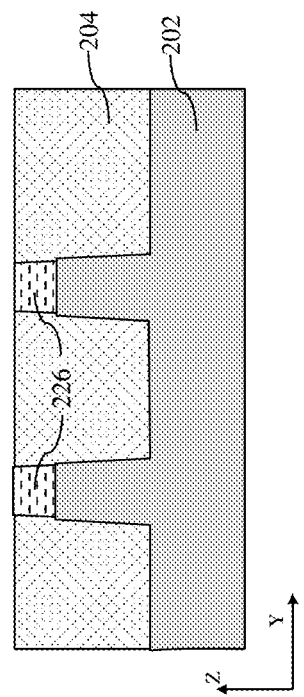
Figure 11B:
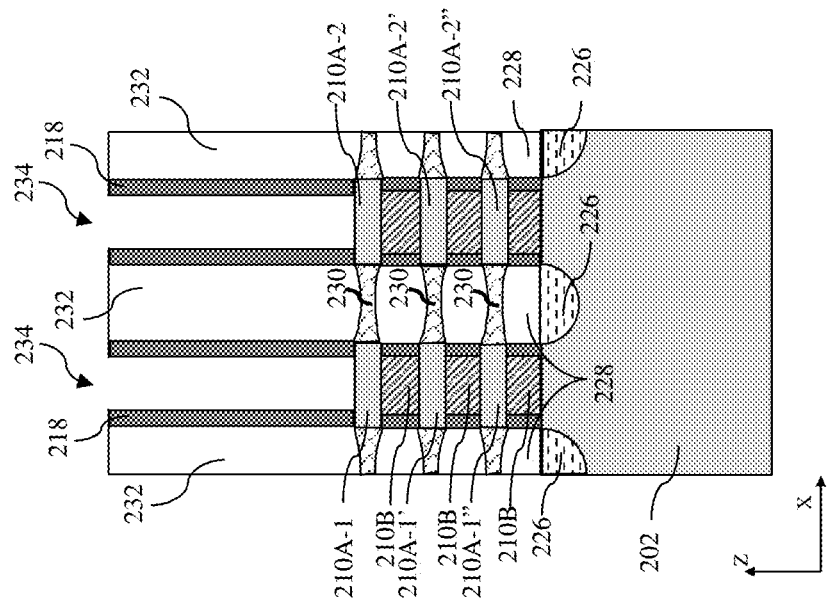
Figure 11A:
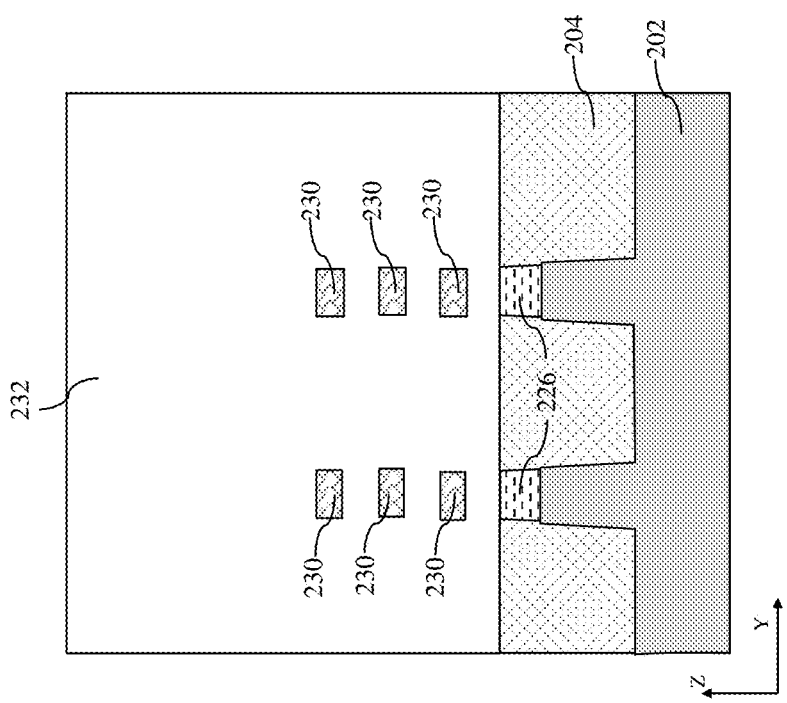

Referring to FIGS. 9A and 9B, a bottom feature 226 is formed in the further recessed portion of the S/D trenches 222. In some embodiments, the bottom feature 226 includes an undoped epitaxy material different from the material of the second semiconductor layers, such as SiC, gallium arsenide (GaAs), etc.; an alloy semiconductor; or combinations thereof. The epitaxy material is undoped such that the resistance is high, and the unexpected leakage can be mitigated. The bottom feature 226 is epitaxially grown in the further recessed portion of the S/D trenches 222 by CVD deposition (for example, vapor-phase epitaxy (VPE), ultra-high vacuum CVD (UHV-CVD), low-pressure CVD (LPCVD), and/or plasma-enhanced (PECVD)), molecular beam epitaxy (MBE), other suitable selective epitaxial growth (SEG) processes, or combinations thereof. As depicted in FIGS. 9A and 9B, the top surfaces of the bottom features 226 is below the bottom surface of the lowermost first semiconductor layer 210A (including semiconductor layer portions 210A-1" and 210A-2"). In some embodiments, the top surfaces of the bottom features 226 are substantially coplanar with the bottom surface of the lowermost second semiconductor layer 210B, i.e. the top surface of the substrate 202. In some other embodiments, the top surfaces of the bottom features 226 are above the bottom surface of the lowermost second semiconductor layer 210B, i.e. the top surface of the substrate 202. Referring to FIG. 9B, the bottom feature 226 has a thickness H4 in the Z-direction. In some embodiments, the thickness H4 is about 20 nm to about 60 nm, which is about 1 to about 10 times of the thickness H1 or H2 of the semiconductor layers 210A or 210B. The bottom feature 226 cannot be too thin, otherwise it may not provide enough resistance and the unexpected leakage may occur; and the bottom feature 226 cannot be too thick, otherwise unexpected capacitance may be increased.

Now referring to FIGS. 1, 10A, and 10B, at operation 112, the S/D layers 230 are epitaxially grown between the corresponding portions of the first semiconductor layers 210A in the S/D trenches 222. In some embodiments, the epitaxial S/D layers 230 include a semiconductor material such as Si or Ge; a compound semiconductor such as SiGe, SiC, gallium arsenide (GaAs), etc.; an alloy semiconductor; or combinations thereof. An epitaxy process may be implemented to epitaxially grow the S/D layers 230. The epitaxy process may comprise CVD deposition (for example, VPE, UHV-CVD, LPCVD, and/or PECVD), MBE, other suitable SEG processes, or combinations thereof. In some embodiments, a cyclic deposition/etching (CDE) process is performed to form the S/D layers 230. For example, when epitaxially growing the semiconductor material, an etching gas (for example, chlorine gas ($Cl_2$) is applied to the growing process. Thereby, the crystalline lattice only growing in the X-direction to form the S/D layers 230 without merging in the Z-direction. As depicted in FIG. 10B, crystalline layers are formed between sidewalls of the corresponding portions of the first semiconductor layer 210A and connected the corresponding portions of the first semiconductor layer 210A in the S/D trenches 222. In other words, the crystalline layers form bridges between the corresponding portions of the first semiconductor layers 210A in the S/D trenches 222. For example, the crystalline layers are epitaxially grown between the semiconductor layer portions 210A-1 and 210A-2, between the semiconductor layer portions 210A-1' and 210A-2', and between the first semiconductor layer portions 210A-1" and 210A-2" and form bridge epitaxial S/D layers 230 therebetween. In some embodiments, when the S/D layers 230 are formed by the CDE process, as a result of implementing the etching gas, a thickness of the middle portion is less than a thickness of the edge portions of each S/D layer. Referring to FIG. 10B, the epitaxial S/D layers 230 growing along a direction D which forms an angle α with the X-direction. In some embodiments, the angle α is less than about 45 degrees such that the epitaxial S/D layers 230 will not disconnect in the middle.

With a suitable ratio H/W between the thickness H1 of the first semiconductor layers (i.e. the thickness of the edge portions of the S/D layers 230) and the distance W1 (in the X-direction) between the corresponding portions of the first semiconductor layers (i.e. the width of the S/D trenches 222), the crystalline layers are epitaxially grown to form the epitaxial S/D layers 230 physically separated from each other. In other words, the epitaxial S/D layers 230 are formed without merging in the Z-direction. In addition, the distance H2 (in the Y-direction) of the first semiconductor layers (i.e. the thickness of the second semiconductor layers210B) also help to ensure the isolation of the epitaxial S/D layers 230. The suitable ratio H/W also refers to as a ration of the thickness (in the Z-direction) and the length (in the X-direction) of the epitaxial S/D layers 230. In some embodiments, the suitable ratio H/W is about 0.1 to about 0.6. If the ratio is too large, the S/D layers may merge in the Z-direction; if the ratio is too small, the S/D layers may be disconnected in the middle. Referring to FIG. 10B, a thickness H1 of each epitaxial S/D layer 230 in the Z-direction is about 5 nm to about 20 nm, a length W1 of each epitaxial S/D layer 230 in the X-direction is about 30 nm to about 50 nm, a distance H2 between the first semiconductor layers 210A in the Z-direction is about 5 nm to about 20 nm. As depicted in FIG. 10B, bottom voids 228 are formed between the lowermost epitaxial S/D layer 230 and the bottom feature 226. Referring to FIG. 10B, the middle portion of each epitaxial S/D layer 230 has the least thickness H3 of the epitaxial S/D layer 230. In some embodiments, the thickness H3 is about 20% to about 100% of the thickness H1 of the edge portion of each epitaxial S/D layer 230. The thickness H3 cannot be too small as it may cause easy breakage of the epitaxial S/D layer 230. The thickness H3 cannot exceed 100% of H1 because of the epitaxial growing angle α intrinsic to the CDE process.

In a convention GAA device, the epitaxial S/D features are bulk features formed in the S/D regions of the GAA device. However, in the present disclosure, based on the separated channel semiconductor layers (for example, semiconductor layers 210A) of the GAA device, the S/D features are epitaxially grown in the S/D regions as separated epitaxial layers (for example, the bridge epitaxial S/D layers 230) between the corresponding portions of the channel semiconductor layers. Compare with the conventional bulk S/D features, the size of the epitaxial features (i.e. separated epitaxial S/D layers) is reduced in the present disclosure. Thereby, the charging and discharging time of the epitaxial features are reduced, and the speed of the semiconductor device is increased. In addition, the smaller sized epitaxial features may cause less capacitance compare with the conventional bulk size epitaxial features. Therefore, the performance of the semiconductor device can be improved.

Now referring to FIGS. 1, 11A, 11B, 12A, 12B, 13A, and 13B, at operation 114, a metal gate replacement process is performed to replace the dummy gate structures 220 with metal gate structures 240. The metal gate replacement process includes various processing steps. For example, referring to FIGS. 11A and 11B, an interlayer dielectric (ILD) layer 232 is formed over the substrate 202. For example, the ILD layer 232 is disposed along the gate spacers 218, over the isolation structure 204, and around the epitaxial S/D features 230. In some embodiments, the ILD layer 232 comprises a low-k (K<3.9) dielectric material, such as tetraethylorthosilicate (TEOS), un-doped silicate glass, or doped silicon oxide such as borophosphosilicate glass (BPSG), fluorosilicate glass (FSG), phosphosilicate glass (PSG), boron doped silicon glass (BSG), other suitable dielectric materials, or combinations thereof. The ILD layer 232 may be formed by deposition processes such as CVD, flowable CVD (FCVD), spin-on-glass (SOG), other suitable methods, or combinations thereof.

Thereafter, the dummy gate structures 220 are removed to form gate trenches 234 exposing the channel regions of the stacks 210. In some embodiments, removing the dummy gate structures 220 comprises one or more etching processes, such as wet etching, dry etching, reactive-ion etching (ME), or other etching techniques. In some embodiments, the top portions of the ILD layer 232 and the spacers 218 are also removed at operation 114. The semiconductor layers 210A and 210B are then exposed in the gate trenches 234.

Subsequently, referring to FIGS. 12A and 12B, the semiconductor layers 210B are selectively removed from the gate trenches 234. Due to the different materials of the semiconductor layers 210A and 210B, the semiconductor layers 210B are removed by a selective oxidation/etching process similar as those to remove the edge portions of the semiconductor layers 210B. In some embodiments, the semiconductor layers 210A are slightly etched or not etched during the operation 114. Thereby, the semiconductor layers 210A are suspended in the channel regions of the stacks 210 and stacked up along the direction (Z-direction) generally perpendicular to the top surface of the substrate 202 (X-Y plane). The suspended semiconductor layers 210A are also referred to as channel semiconductor layers 210A.

Figure 13B:
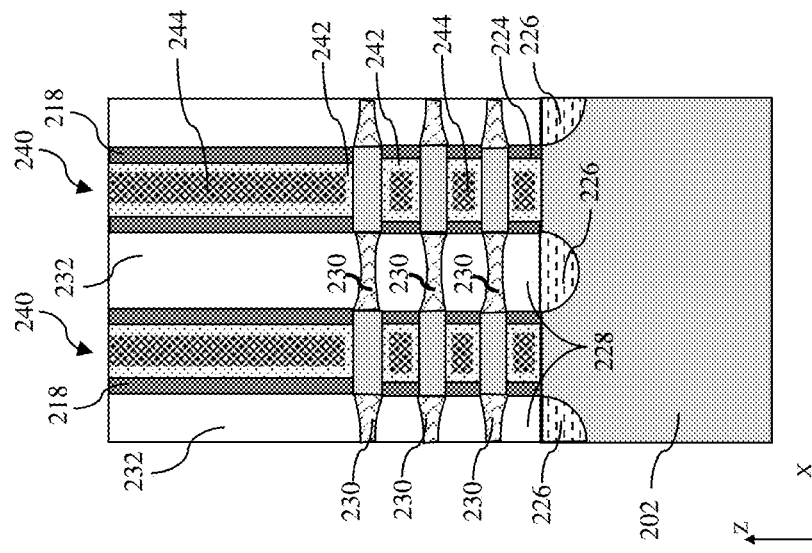
Figure 13A:
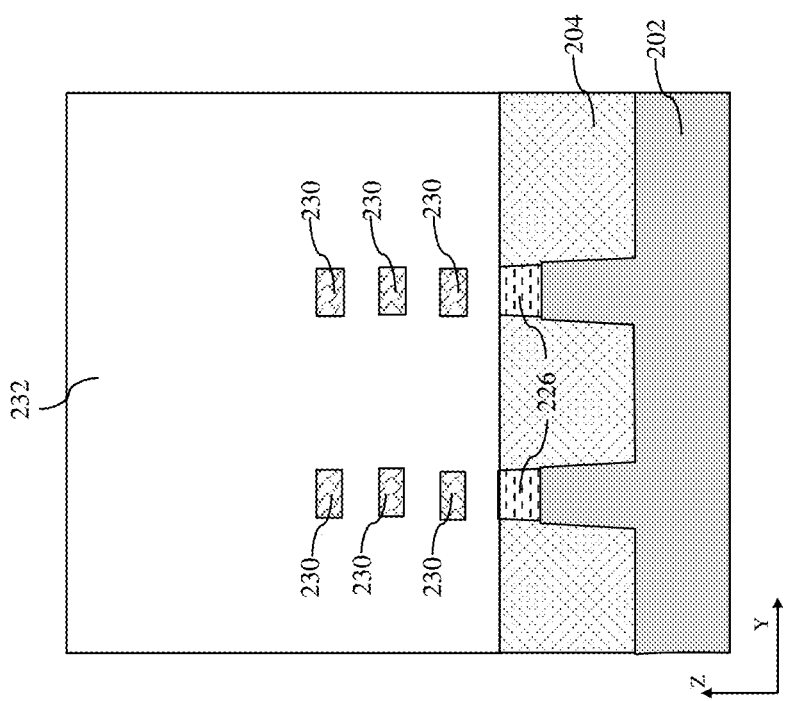

Then, referring to FIGS. 13A and 13B, metal gate structures 240 are formed in the channel regions of the stacks 210. The metal gate structures 240 wrap each of the suspended semiconductor layers 210A. In some embodiments, each metal gate structure 240 may include a gate dielectric layer 242 wrapping around each of the channel semiconductor layers 210A, a metal gate electrode 244 over the gate dielectric layer 242, and other suitable layers. The gate dielectric layer 242 includes a high-k (K>3.9) dielectric material, such as HfO2, HfSiO, HfSiO4, HfSiON, HfLaO, HfTaO, HfTiO, HfZrO, HfAlOx, ZrO, ZrO2, ZrSiO2, AlO, AlSiO, Al2O3, TiO, TiO2, LaO, LaSiO, Ta2O3, Ta2O5, Y2O3, SrTiO3, BaZrO, BaTiO3 (BTO), (Ba,Sr)TiO3 (BST), Si3N4, hafnium dioxide-alumina (HfO2-Al2O3) alloy, other suitable high-k dielectric material, or combinations thereof. In some embodiments, the gate dielectric layer 242 is deposited by CVD, PVD, ALD, and/or other suitable method. In some embodiments, each metal gate electrode 244 includes one or more work function metal (WFM) layers and a bulk metal. The WFM layer is configured to tune a work function of its corresponding transistor to achieve a desired threshold voltage Vt. And, the bulk metal is configured to serve as the main conductive portion of the functional gate structure. In some embodiments, the material of the WFM layer may include TiAl, TiAlC, TaAlC, TiAlN, TiN, TSN, TaN, WCN, Mo, other materials, or combinations thereof. The bulk metal may include Al, W, Cu, or combinations thereof. The various layers of the metal gate electrode 244 may be formed by any suitable method, such as CVD, ALD, PVD, plating, chemical oxidation, thermal oxidation, other suitable methods, or combinations thereof. Thereafter, one or more polishing processes (for example, CMP) are applied to remove any excess conductive materials and planarize the top surface of the device 200.

Figure 14B:
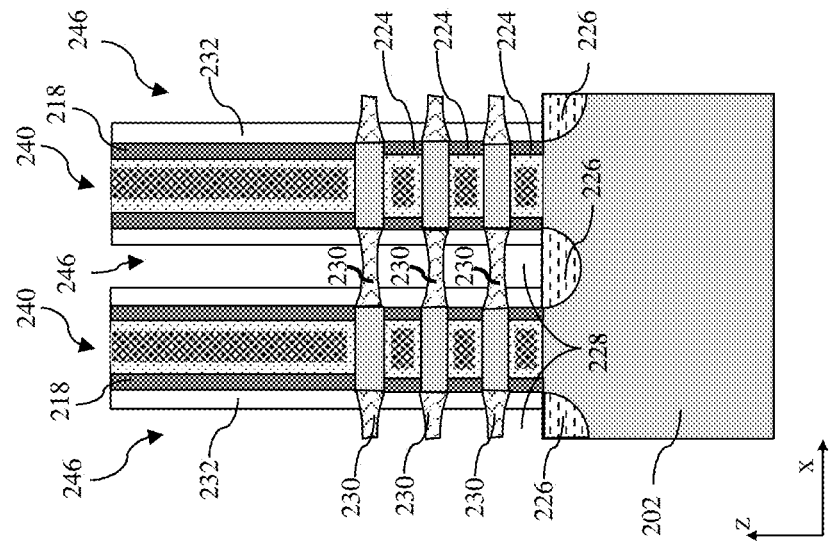
Figure 14A:
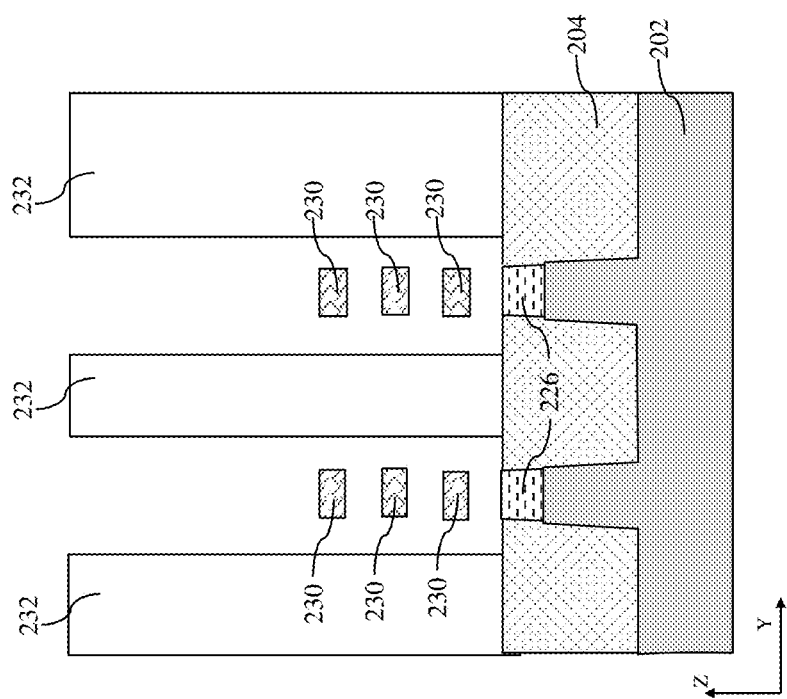

Referring to FIGS. 1, 14A, 14B, 15A, and 15B, at operation 116, S/D contacts 250 are formed to wrap each epitaxial S/D layers 230. Referring to FIGS. 14A and 14B, the ILD layer 232 in the S/D regions is removed by a photolithography process and a wet etching process to form contact trenches 246. In some embodiments, a portion of the ILD layer 232 remain along the gate spacers 218 and inner spacers 224 in the S/D regions. The remained portion of the ILD layer 232 may have a thickness in the X-direction substantially equal to that of the gate spacers 218. Thereby, the epitaxial S/D layers 230 are exposed in the contact trenches 246. As discussed above, the epitaxial S/D layers 230 are separated from each other in the Z-direction. And, the lowermost epitaxial S/D layers 230 are separated from the bottom features 226 by bottom voids 228.

Figure 15B:
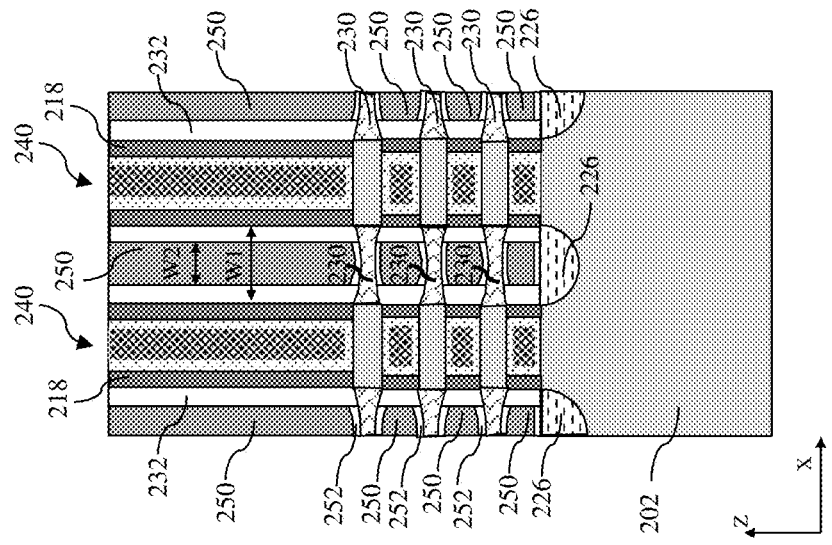
Figure 15A:
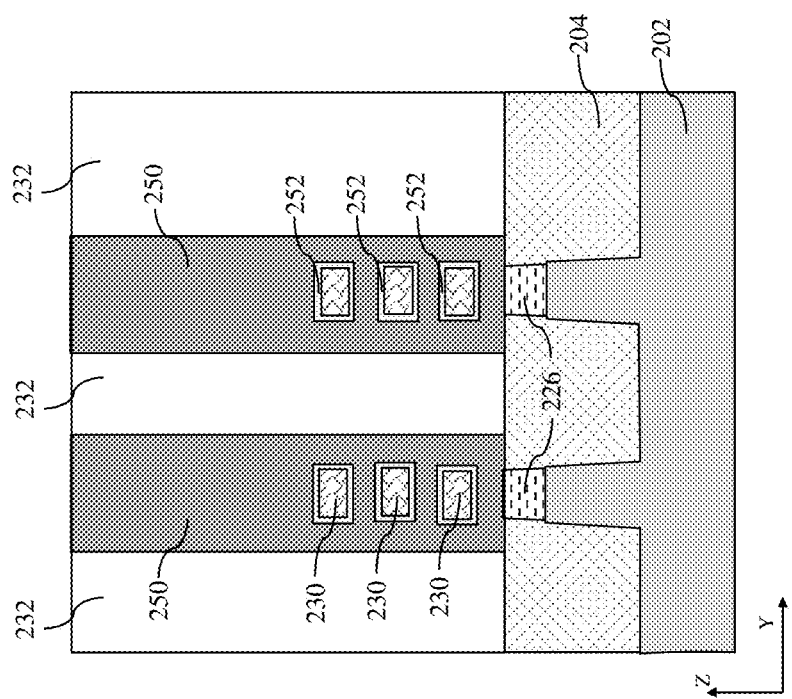

Referring to FIGS. 15A and 15B, a conductive material is then deposited in the contact trenches 246 to form the S/D contacts 250 wrapping each of the epitaxial S/D layers 230. In some embodiments, the conductive material includes Al, W, Cu, other conductive material, or combinations thereof. The conductive material may be deposited by CVD, ALD, PVD, plating, chemical oxidation, thermal oxidation, other suitable methods, or combinations thereof. In some embodiments, silicide layers 252 may be formed between the S/D contacts 250 and the S/D layers 230. In some embodiments, the silicide layers 252 include Titanium Silicide (TiSi, TiSi2), Nickel Silicide (NiSi), Platinum Silicide (PtSi, PtSi2), Cobalt Silicide (CoSi, CoSi2), Molybdenum Silicide (MoSi), Titanium Platinum Silicide (TiPtSi), Nickel Platinum Silicide (NiPtSi), other suitable metal, or combinations thereof. In some other embodiments, the silicide layers 252 can be formed before forming the S/D contacts 250. For example, a metal layer may be deposited around the S/D layers 230 in the S/D regions. The metal layers are then heated (i.e. annealing process) to react with the S/D layers 230 to form the silicide layers 252. Thereafter, the conductive material of S/D contacts 250 are deposited in the S/D regions. In some embodiments, the silicide layers 252 are considers as a portion of the S/D contacts 250. And, one or more polishing processes (for example, CMP) are applied to remove any excess conductive materials and planarize the top surface of the device 200. As depicted in FIGS. 15A and 15B, the S/D contacts 250 wrap each of the S/D epitaxial layers 230 in the S/D regions. The S/D contacts 250 are separated from the metal gate structures 240 by the gate spacers 218, the inner spacers 224 and the ILD layer 232. And, the lowest portions of the S/D contacts 250 filling in the bottom voids 228 are isolated from the substrate 202 by the bottom features 226, thereby the current leakage issue between the S/D contacts 250 and the substrate 202 can be mitigated. Referring to FIG. 15B, the S/D contact 250 (or the silicide layer 252) has a width W2 in the X-direction. When the W2 is too large, the isolation between the S/D contact and the metal gate structure 240 may be too small, which may cause unexpected parasitic capacitance. When the W2 is too small, the S/D contact resistance may be too large. In some embodiments, the width W2 is about 40% to about 90% of the width W1 between the gate spacers 218, depending on the design of the device 200.

Figure 16A:
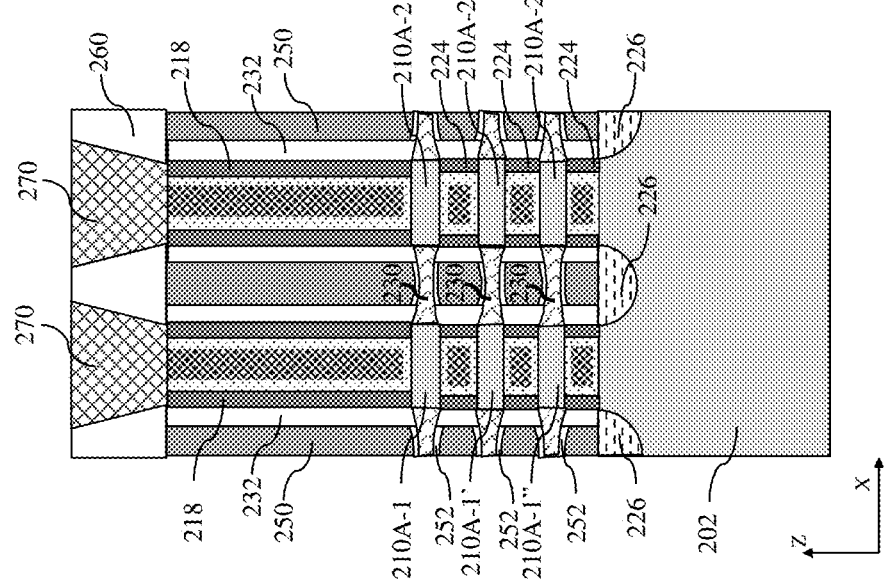
Figure 16B:
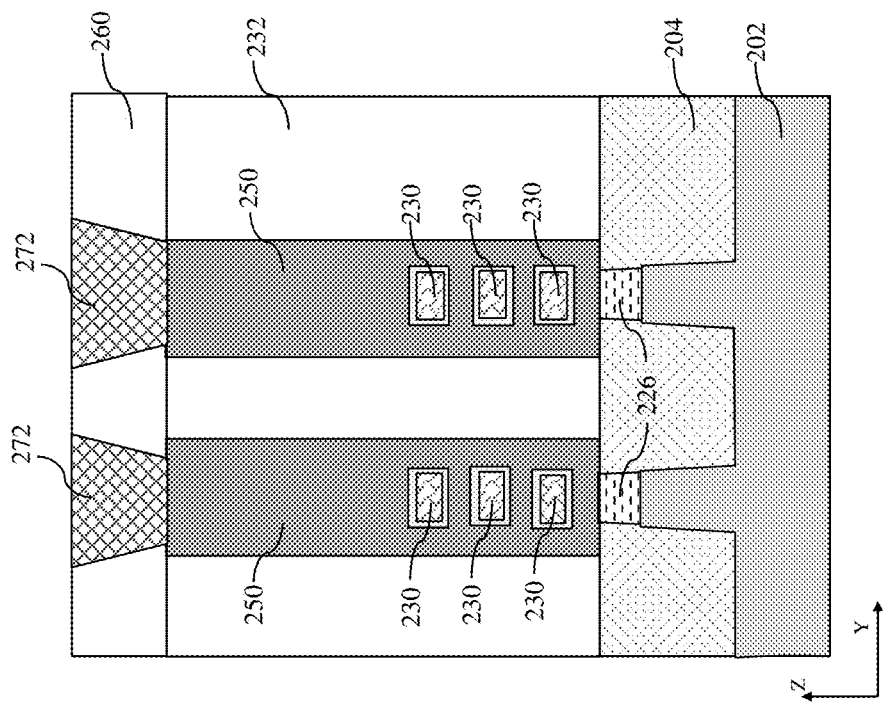

Referring to FIGS. 1, 16A, and 16B, at operation 118, further processing is performed to complete the fabrication of the device 200. For example, it may form various contacts/vias 270, 272, metal lines (not shown), as well as other multilayer interconnect features, such as ILD layers 260 and/or etch stop layer (ESLs) over the device 200, configured to connect the various features to form a functional circuit that comprises the different semiconductor devices.

Although not intended to be limiting, one or more embodiments of the present disclosure provide many benefits to a semiconductor device and a formation process thereof. For example, embodiments of the present disclosure provide a semiconductor device including epitaxial S/D layers grown between the corresponding portions of the channel semiconductor layers and forming bridges between the corresponding portions of the channel semiconductor layers. S/D contacts are formed to wrap each of the separated epitaxial S/D layers and is isolated from the substrate by a bottom dielectric feature. The separated epitaxial S/D layers reduce the size of the epitaxial feature, thus can reduce the capacitance and increase the charging/discharging speed. Therefore, the performance of the semiconductor device is improved.

The present disclosure provides for many different embodiments. In one embodiment, a semiconductor device is provided. The semiconductor device includes semiconductor layers over a substrate. The semiconductor layers are stacked up and separated from each other. Each semiconductor layer includes a first portion in a first channel region of the substrate and a second portion in a second channel region of the substrate. The semiconductor device may further include epitaxial layers formed in a source/drain region between the first channel region and the second channel region. the epitaxial layers are separated from each other and each epitaxial layer is formed between the first portion and the second portion of each semiconductor layer and a conductive feature wrapping each of the epitaxial layers.

In some embodiments, the semiconductor device may further include a metal gate structure wrapping each of the semiconductor layers. The metal gate structure includes a metal gate stack wrapping each of the semiconductor layers and inner spacers along sidewalls of the metal gate stack. In some implementations, the semiconductor device may further include an interlayer dielectric (ILD) layer formed along sidewalls of the inner spacers, wherein the conductive feature contacts the ILD layer. In some instances, the semiconductor device may further include a bottom feature disposed between the conductive feature and the substrate and the bottom feature includes an undoped epitaxy material. In some embodiments, the semiconductor device may further include an isolation structure separating active regions of the semiconductor device and contacting sidewalls of the bottom feature. In some implementations, a top surface of the bottom feature is below a bottom surface of a lowermost semiconductor layer. In some instances, a ratio of a thickness of each semiconductor layer to a length of each epitaxial layer between the first portion and the second portion of each of the semiconductor layer is about 0.1 to about 0.6.

In another aspect, the present disclosure provides a semiconductor device. The semiconductor device may include first semiconductor layers over a first channel region of a substrate and second semiconductor layers over a second channel region of the substrate. The first semiconductor layers are stacked up and separated from each other and the second semiconductor layers are stacked up and separated from each other. The semiconductor device may further include an epitaxial layer formed in a source/drain region of the substrate and between one of the first semiconductor layers and one of the second semiconductor layers, a conductive feature wrapping around the epitaxial layer in the source/drain region, and a bottom feature formed between the conductive feature and the substrate. A bottom surface of the epitaxial layer is above a top surface of the substrate.

In some embodiments, the bottom feature includes an undoped epitaxy material and a top surface of the bottom feature is substantially coplanar with or above a top surface of the substrate. In some implementations, a thickness of a middle portion of the epitaxial layer is less than a thickness of an edge portion of the epitaxial layer. In some instances, the conductive feature includes a silicide layer formed around the epitaxial layer and a bulk metal over the silicide layer.

In yet another aspect, the present disclosure provides a method of forming a semiconductor device. The method may include alternately forming first semiconductor layers and second semiconductor layers over a substrate, wherein the first semiconductor layers and the second semiconductor layers include different materials and are stacked up along a direction substantially perpendicular to a top surface of the substrate, forming dummy gate structures over the first and second semiconductor layers, forming source/drain (S/D) trenches along sidewalls of the dummy gate structures such that the first semiconductor layers and the second semiconductor layers are truncated by the S/D trenches, and forming epitaxial layers between the truncated first semiconductor layers in the S/D trenches, wherein the epitaxial layers are separated along the direction substantially perpendicular to the top surface of the substrate.

In some embodiments, the forming the S/D trenches includes etching along the sidewalls of the dummy gate structures until sidewalls of the lowermost second semiconductor layer are exposed to form the S/D trenches, selectively removing edge portions of the second semiconductor layers, and forming inner spacers to fill in the removed edge portions of the second semiconductor layers. In some implementations, the forming the S/D trenches may further include further etching the S/D trenches such that a bottom surface of the S/D trenches is below the top surface of the substrate, and forming a bottom feature including an undoped epitaxy material in the further etched S/D trenches. In some instances, a top surface of the bottom feature is below a bottom surface of the lowermost first semiconductor layer. In some embodiments, the method may further include depositing an interlayer dielectric(ILD) layer wrapping the epitaxial layers in the S/D trenches, wherein a bottom surface of the ILD layer contacts a top surface of the bottom feature, and replacing the dummy gate structures with metal gate structures. In some instances, the method may further include removing a portion of the ILD layer to expose the epitaxial layers in the S/D trenches. In some embodiments, the method may further include forming a contact feature wrapping each of the exposed epitaxial layers in the S/D trenches, wherein a bottom surface of the contact feature contacting a top surface of the bottom feature. In some implementations, the forming of the contact feature includes depositing a conductive material layer around the exposed epitaxial layers, performing an annealing process to form a silicide layer, and depositing a conductive material over the silicide layer to form the contact feature. In some embodiments, the epitaxial layers are formed by a cyclic deposition etching process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a fin-shaped structure over a substrate and extending lengthwise along a direction, the fin-shaped structure comprising a plurality of first semiconductor layers interleaved by a plurality of second semiconductor layers;
    forming an isolation structure over the substrate to surround a lower portion of the fin-shaped structure;
    forming a first dummy gate structure over a first channel region of the fin-shaped structure and a second dummy gate structure over a second channel region of the fin-shaped structure;

etching a source/drain region of the fin-shaped structure to form a source/drain trench and to expose sidewalls of the plurality of first semiconductor layers and the plurality of second semiconductor layers, the source/drain region being disposed between the first channel region and the second channel region;

recessing the source/drain trench such that sidewalls of the isolation structure are exposed in the source/drain trench;

after the recessing, depositing a bottom feature over a bottom surface of the source/drain trench;

after the depositing of the bottom feature, epitaxially growing a plurality of source/drain features extending between the plurality of first semiconductor layers under the first dummy gate structure and the plurality of first semiconductor layers under the second dummy gate structure; and forming a source/drain contact to wrap around each of the plurality of source/drain features and to interface the bottom feature, wherein each of the plurality of source/drain features comprises two edge portions and a middle portion disposed between the two edge portions along the direction, wherein a thickness of the middle portion is smaller than a thickness of the two edge portions.

2. The method of claim 1, wherein the plurality of first semiconductor layers comprise silicon and the plurality of second semiconductor layers comprise silicon germanium.

3. The method of claim 1, wherein the depositing of the bottom feature comprising epitaxially depositing the bottom feature using vapor-phase epitaxy (VPE), ultra-high vacuum chemical vapor deposition (UHV-CVD), low-pressure CVD (LPCVD), and/or plasma-enhanced CVD (PECVD)), molecular beam epitaxy (MBE), or selective epitaxial growth (SEG).

4. The method of claim 3, wherein the bottom feature comprises undoped silicon carbide or undoped gallium arsenide.

5. The method of claim 1, further comprising:

after the epitaxially growing, depositing an interlayer dielectric (ILD) layer to wrap around each of the plurality of source/drain features;

removing the first dummy gate structure and the second dummy gate structure;

selectively removing the plurality of second semiconductor layers in the first channel region and the second channel region to suspend the plurality of first semiconductor layers in the first channel region and the second channel region; and after the selectively removing, forming a first gate structure to wrap around each of the plurality of first semiconductor layers in the first channel region and a second gate structure to wrap around each of the plurality of first semiconductor layers in the second channel region.

6. The method of claim 1, further comprising:

after the etching the source/drain region of the fin-shaped structure, partially and selectively recessing the sidewalls of the plurality of second semiconductor layers in the first channel region and the second channel region to form inner spacer recesses; and forming inner spacers in the inner spacer recesses.

7. A method, comprising:

receiving a semiconductor structure comprising:
   a substrate,
   a fin-shaped structure disposed over the substrate and comprising:
      a lower portion patterned from the substrate, and
      a top portion including a plurality of first semiconductor layers interleaved by a plurality of second semiconductor layers,
   an isolation feature surrounding the lower portion of the fin-shaped structure;
   a first dummy gate structure over a first channel region of the fin-shaped structure, and
   a second dummy gate structure over a second channel region of the fin-shaped structure;

etching a source/drain region of the fin-shaped structure to form a source/drain trench and to expose sidewalls of the plurality of first semiconductor layers and the plurality of second semiconductor layers, the source/drain region being disposed between the first channel region and the second channel region;

after the etching the source/drain region of the fin-shaped structure, partially and selectively recessing the sidewalls of the plurality of second semiconductor layers in the first channel region and the second channel region to form inner spacer recesses;

forming inner spacers in the inner spacer recesses;

after the forming of the inner spacers, further recessing the source/drain trench such that the source/drain trench partially extends into the lower portion;

depositing a bottom feature over a bottom surface of the source/drain trench such that a bottom surface of the bottom feature is lower than a top surface of the lower portion in the first channel region;

epitaxially growing a plurality of source/drain features extending between the plurality of first semiconductor layers under the first dummy gate structure and the plurality of first semiconductor layers under the second dummy gate structure;

after the epitaxially growing, depositing an interlayer dielectric (ILD) layer to wrap around each of the plurality of source/drain features; and forming a source/drain contact to wrap around each of the plurality of source/drain features such that the source/drain contact is spaced apart from the inner spacers by the ILD layer.

8. The method of claim 7, wherein the bottom feature comprises undoped silicon carbide or undoped gallium arsenide.

9. The method of claim 7, further comprising:

removing the first dummy gate structure and the second dummy gate structure;

selectively removing the plurality of second semiconductor layers in the first channel region and the second channel region to suspend the plurality of first semiconductor layers in the first channel region and the second channel region; and after the selectively removing, forming a first gate structure to wrap around each of the plurality of first semiconductor layers in the first channel region and a second gate structure to wrap around each of the plurality of first semiconductor layers in the second channel region.

10. The method of claim 7, wherein the source/drain contact comprises aluminum, tungsten, or copper.

11. The method of claim 7, further comprising:

before the forming of the source/drain contact, forming a metal silicide layer to wrap around each of the plurality of source/drain features.

12. A method of forming a semiconductor device, comprising:

alternately forming first semiconductor layers and second semiconductor layers over a substrate, wherein the first semiconductor layers and the second semiconductor layers include different materials and are stacked up along a direction substantially perpendicular to a top surface of the substrate;

forming dummy gate structures over the first and second semiconductor layers;

forming source/drain (S/D) trenches along sidewalls of the dummy gate structures such that the first semiconductor layers and the second semiconductor layers are truncated by the S/D trenches;

selectively removing edge portions of the second semiconductor layers;

forming inner spacers to fill in the removed edge portions of the second semiconductor layers;

after the forming of the inner spacers, further recessing the S/D trenches such that the S/D trenches partially extend into the substrate;

after the further recessing, forming a bottom feature that includes an undoped epitaxy material in the S/D trenches; and after the forming of the bottom feature, forming epitaxial layers between the truncated first semiconductor layers in the S/D trenches, wherein the epitaxial layers are separated along the direction substantially perpendicular to the top surface of the substrate.

13. The method of claim 12, wherein a top surface of the bottom feature is below a bottom surface of the lowermost first semiconductor layer.

14. The method of claim 12, further comprising:

depositing an interlayer dielectric (ILD) layer wrapping the epitaxial layers in the S/D trenches, wherein a bottom surface of the ILD layer contacts a top surface of the bottom feature; and replacing the dummy gate structures with metal gate structures.

15. The method of claim 14, further comprising:

removing a first portion of the ILD layer to expose the epitaxial layers in the S/D trenches while a second portion of the ILD layer covers the inner spacers.

16. The method of claim 15, further comprising:

forming a contact feature wrapping each of the exposed epitaxial layers in the S/D trenches, wherein a bottom surface of the contact feature contacting a top surface of the bottom feature.

17. The method of claim 16, wherein forming the contact feature includes:

depositing a conductive material layer around the exposed epitaxial layers;

performing an annealing process to form a silicide layer; and depositing a conductive material over the silicide layer to form the contact feature.

18. The method of claim 12, wherein the epitaxial layers are formed by a cyclic deposition etching process.

19. The method of claim 16, wherein the contact feature is spaced apart from the inner spacers by the second portion of the ILD layer.

20. The method of claim 18, wherein each of the epitaxial layers comprises two edge portions and a middle portion disposed between the two edge portions, wherein a thickness of the middle portion is smaller than a thickness of the two edge portions.

* * * * *